United States Patent [19]
Carey et al.

[11] Patent Number: 5,466,302
[45] Date of Patent: Nov. 14, 1995

[54] SOLAR CELL ARRAY INTERCONNECTS

[75] Inventors: Paul G. Carey, Mountain View; Jesse B. Thompson, Brentwood; Nicolas J. Colella, Livermore; Kenneth A. Williams, Livermore, all of Calif.

[73] Assignee: Regents of the University of California, Oakland, Calif.

[21] Appl. No.: 239,866

[22] Filed: May 9, 1994

[51] Int. Cl.$^6$ .............................. H01L 31/05; H01L 31/18
[52] U.S. Cl. .............................. 136/251; 136/244; 437/2; 437/51; 437/205; 437/209; 228/179.1; 228/180.21
[58] Field of Search ..................................... 136/244, 251; 437/2–5, 51, 205, 207, 209; 228/179.1, 180.21

[56] References Cited

U.S. PATENT DOCUMENTS

| | | | |
|---|---|---|---|
| 3,370,986 | 2/1968 | Amsterdam et al. | 136/244 |
| 3,574,925 | 4/1971 | Schneider et al. | 228/180.21 |
| 4,083,097 | 4/1978 | Anagnostoo et al. | 437/2 |
| 4,296,270 | 10/1981 | Köhler | 136/244 |
| 5,296,043 | 3/1994 | Kawakami et al. | 136/244 |

OTHER PUBLICATIONS

H. S. Rauschenbach, "Solar Cell Array Design Handbook", Van Nostrand Reinhold Co., New York (1980), p. 367.

*Primary Examiner*—Aaron Weisstuch
*Attorney, Agent, or Firm*—Henry P. Sartorio; L. E. Carnahan

[57] ABSTRACT

Electrical interconnects for solar cells or other electronic components using a silver-silicone paste or a lead-tin (Pb-Sn) no-clean fluxless solder cream, whereby the high breakage of thin (<6 mil thick) solar cells using conventional solder interconnect is eliminated. The interconnects of this invention employs copper strips which are secured to the solar cells by a silver-silicone conductive paste which can be used at room temperature, or by a Pb-Sn solder cream which eliminates undesired residue on the active surfaces of the solar cells. Electrical testing using the interconnects of this invention has shown that no degradation of the interconnects developed under high current testing, while providing a very low contact resistance value.

16 Claims, 2 Drawing Sheets

SOLAR CELL ARRAY INTERCONNECTS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to electrical interconnects for solar cells and other electronic components, particularly to electrical interconnects for thin (<6 mil thick) solar cells whereby breakage due to conventional soldering is eliminated, and more particularly to electrical interconnects and a process for forming same using a silver-silicone paste or a lead-tin solder cream.

Solar cells have a wide variety of applications, and are particularly useful in various space applications. Substantial research and development efforts have been directed toward the use of solar cells for space systems. One such application is the RAPTOR Pathfinder solar electric airplane being developed to enable long endurance high altitude flight for weeks and months, with flight altitudes exceeding 10,000 ft. The Pathfinder uses electric powered flight by covering the upper wing skin with light weight (thin) flexible solar array modules, composed of solar cells up to 25 mil thick.

Experiments have shown that solar cell electrical interconnect soldering can cause solar cell breakages for thin (<6 mil thick) silicon solar cells as well as leave undesired residue on the active surfaces thereof. This is due, in part, to the 200° C. temperature required for soldering, and the solder fluxes used to promote good adhesion. Thus, there has been a need for a method of electrically interconnecting thin solar cells which reduces or eliminates the breakage problem due to soldering, as well as eliminating the undesirable residue.

The present invention provides a solution to the above soldering problems which involves forming the electrical interconnects using copper strips and a conductive silver-silicone paste in place of soldering, or using the copper strips and a conductive lead-tin (Pb-Sn) no-clean fluxless surface mount solder cream. Electrical interconnects made by this invention have shown no degradation under high current testing while having a very low contact resistance value, and have eliminated the solder caused breakage problem for thin solar cells.

SUMMARY OF THE INVENTION

It is an object of this invention to eliminate solar cell breakage caused by conventional electrical interconnect soldering techniques.

A further object of the invention is to provide electrical interconnects for thin (<6 mil thick) solar cells, using silver-based materials.

Another object of the invention is to provide a process of electrically interconnecting electronic components such as solar cells using either a conductive silver-silicone paste or a conductive Pb-Sn no-clean fluxless solder cream, whereby solar cell breakage and undesired residue on the active surfaces of the solar cell are eliminated.

Other objects and advantages of the present invention will become apparent from the following description. In one example of the invention, the electrical interconnects between solar cells are produced by using electrically conductive members such as copper strips (50 mil wide by 3 mil thick) which are attached to each of the metal electrodes on the solar cell using a conductive silver-silicone paste, which can be applied and cured at room temperature. In a second example, the electrical interconnects are produced using the copper strips which are soldered to each solar cell using a conductive Pb-Sn no-clean surface mount solder cream, which requires no additional flux, applied between the copper strips and the metal electrodes on the solar cells before soldering. Tests have established that with solar cell interconnects made by this invention there was no degradation of the interconnects under high current testing, the contact resistance value was very low, and that breakage of the thin solar cells was eliminated.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention is directed to a process for forming electrical interconnects between the electrodes of electronic components, particularly solar cells, which overcomes the problems of forming the interconnects by conventional soldering techniques. As pointed out above, conventional soldering of solar cell electrical interconnects causes breakages due to thermal or mechanical stressing of the solar cells, particularly thin (<6 mil thick) solar cells, which is due, in part, to the 200° C. temperature required during conventional soldering techniques, and the solder fluxes used to promote good adhesion. The present invention uses in one example a silver-silicone paste, and in another example is a lead-tin (Pb-Sn) solder cream, to secure conductive members such as copper strips to the metal electrodes of the solar cells, and tests have shown that interconnects formed by this invention eliminate the breakage of thin solar cells.

Solar cells electrically interconnected in accordance with the present invention can be thereafter laminated using fluoropolymer/adhesive sandwiched layers that encapsulate and hermetically seal the solar cells to provide needed protection in adverse environmental conditions. Such a lamination process is described and claimed in copending U.S. application Ser. No. 08/230,509, filed Apr. 20, 1994, entitled "A Solar Cell Module Lamination Process", and assigned to the same assignee.

While the present invention was conceived and developed for use in the above-referenced solar electric powered unmanned aircraft, known as Pathfinder, as described in more detail in an unpublished document UCRL-ID-115268 by P. G. Carey et al., entitled "A Solar Array Module Fabrication Process for HALE Solar Electric UAVs", bearing a date of December 1993, the electrical interconnects of this invention may be utilized for various solar cell applications, and other types of electronic component interconnections. Also, while the interconnects made in accordance with the processes of this invention are particularly useful for thin (<6 mil thick) solar cells, the processes may be utilized for any solar cell application.

Figure 1:
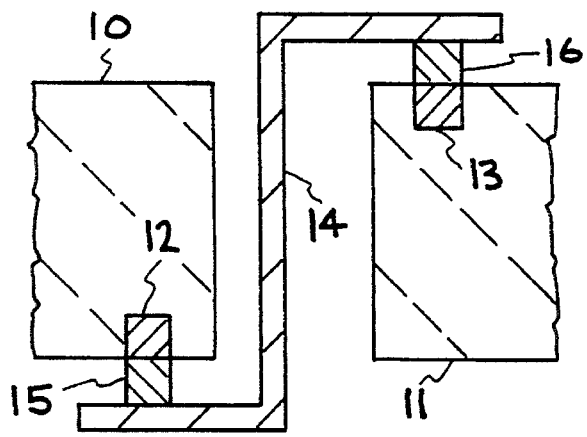
FIGS. 1 and 2, illustrate in partial cross-section, embodiments of enlarged electrical interconnects between solar cells, which can be produced by the present invention.
Figure 2:
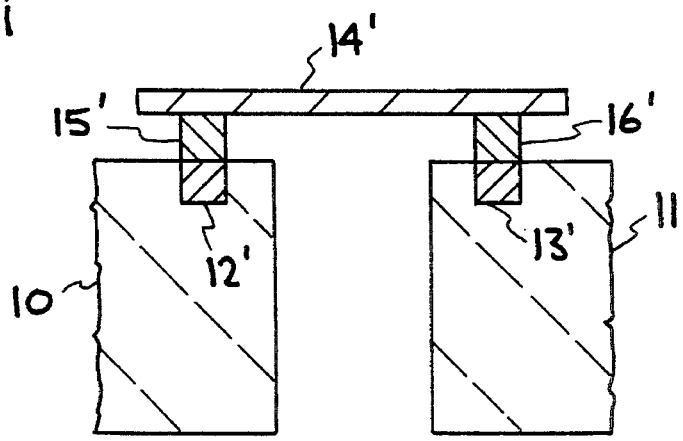

FIGS. 1 and 2 illustrate a pair of electrically interconnected solar cells, with the interconnects being greatly enlarged. In FIG. 1, solar cells 10 and 11 having electrodes 12 and 13, respectively, located on opposite sides thereof, which are electrically connected by a metallic interconnect 14 via a silver-based paste or Pb-Sn solder cream between the electrodes and the interconnects, as indicated at 15 and 16.

In FIG. 2, the electrodes 12' and 13' are located on the same side of solar cells 10 and 11, with the metallic interconnect 14' being secured to the electrodes by a silver-based paste or a Pb-Sn solder cream indicated at 15' and 16'. As described hereinafter, the metallic interconnects may be in the form of copper or silver strips.

The process of the invention will be described in detail hereinafter with respect to Example I directed to the use of silver-silicone paste, and Example II directed to the use of Pb-Sn solder cream. In each of the processes of Examples I and II, the silver and Pb-Sn function to provide the necessary conductive path between an electrode of a solar cell and the associated copper strip of the interconnect.

EXAMPLE I

This interconnect process involves the application of a silver-based material, such as silver-silicone paste in place of soldering. The silver-silicone paste is available commercially and manufactured, for example, by Creative Materials, Inc. (CMI) and consists of 85% silver (Ag), 14% uncured silicone resin, and 1% solvent (toluene). The solvent may also be xylene. The Ag-silicone paste is mixed with a hardening agent, such as CMI's No. 507 (Aminopropyltriethoxysilicone), and used in conjunction with copper strips 50 mils wide by 3 mil thick. Other conductive metal strips such as silver (Ag) may be used in place of the copper strips. The Ag-silicone paste is a highly viscous liquid paste and is applied between the copper strips and the metal electrodes on the thin (<6 mil thick) solar cells, such as silicon solar cells, and then cured at room temperature, which results in an electrical interconnect having some flexibility. More specifically, the positive and negative electrodes of the solar cells to be interconnected are cleaned with an appropriate alcohol/solvent. The Ag-silicone paste is mixed to insure the liquid is homogeneous, after which an appropriate amount of a hardening agent is added. The hardening agent is preferably aminopropyltriethoxysilone with 1–2% by volume amount added to the Agsilicone paste. The mixture (liquid paste) is then applied to the electrodes of the solar cells at room temperature, for example, and the copper strips placed thereon. The Ag-silicone resin (paste) will harden within 90 minutes at room temperature, resulting in a conductive interconnection between the copper strips and the solar cell electrodes.

Utilizing this process there is no heating of the thin solar cells due to the interconnect forming process and thus no thermal or mechanical stressing caused by conventional soldering techniques. Tests have shown that electrical interconnects made by this process show extremely low series resistance (less than 2 mV are dropped across the paste to the solar cell), and that there is no degradation of the interconnects developed under high current testing, while allowing some flexibility after curing.

EXAMPLE II

This interconnect process involves the use of a lead-tin (Pb-Sn)-based material, such as a Pb-Sn no-clean surface mount solder cream, which requires no additional flux and which is very inexpensive and the solar cells are easily cleaned after soldering to remove any residue. This electrically conductive Pb-Sn-based solder cream is easy to use and has excellent electrical characteristics. The Pb-Sn-based surface mount solder cream used in verifying this process was ESP Solder Plus, Part #6-SN63-500-A, consisting of lead-tin (Pb-Sn) with a mixture of rosin, terpene, polyol and carboxylic acid, manufactured by ESP Inc., Lincoln, R.I. The lead-tin solder cream is highly viscous and applied directly to the interconnect contact area (electrodes of the solar cells being connected) and is used in conjunction with conductive metal strips such as copper strips 50 mils (0.050") wide by 3 mils (0.030") thick, which are soldered to teach solar cell electrode, with the soldering temperature being 183° C., but may vary from about 180°–190° C. After soldering, the cells are cleaned using isopropyl alcohol followed by deionized water, leaving an interconnect with some flexibility. More specifically, the Pb-Sn solder cream consists of 37% Pb and 63% Sn by weight, and the flux mixture consists of rosin, terpene, polyol, and carboxylic acid. The Pb-Sn is mixed with the flux mixture composed of 85% Pb-Sn and 15% flux by weight. The Pb-Sn-based solder cream is applied between the copper strips and the metal electrodes on the solar cells by using a syringe applicator to apply a thickness of cream that becomes about 1 mil after soldering. The soldering is carried out by contacting a soldering iron (185°–190° C.) momentarily (<1 sec.) on the Cu (or Ag) interconnect. The underlying solder cream immediately melts and wets the interconnect and the solar cell contact pad. Removal of the heat causes instantaneous solder resolidification.

Electrical testing of finished solar array modules using the Pb-Sn solder cream/copper strip electrical interconnects has shown that no degradation of the interconnects developed under high current testing, and that the contact resistance value was very low at $<10^{-5}$ ohm-cm$^2$.

Figure 3:
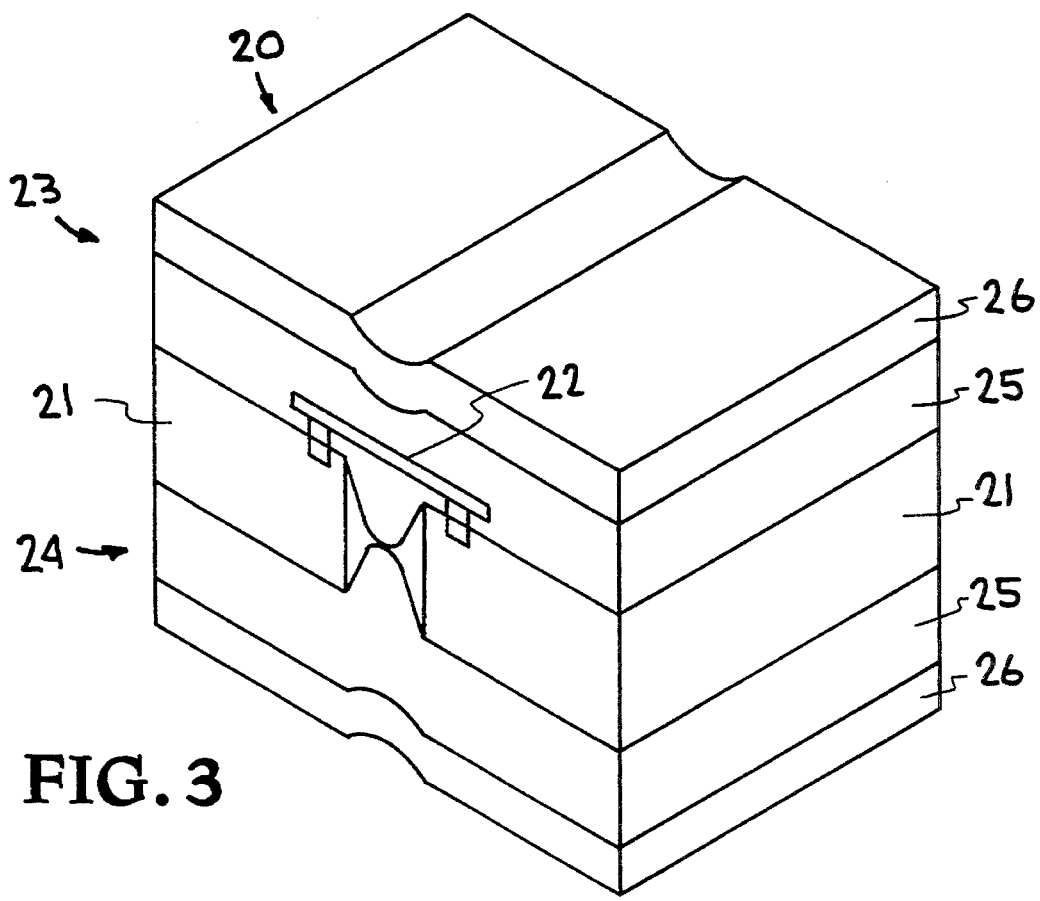
FIG. 3 illustrates a solar array module structure encapsulated between laminate layers to hermetically seal the solar cells.
Figure 4:
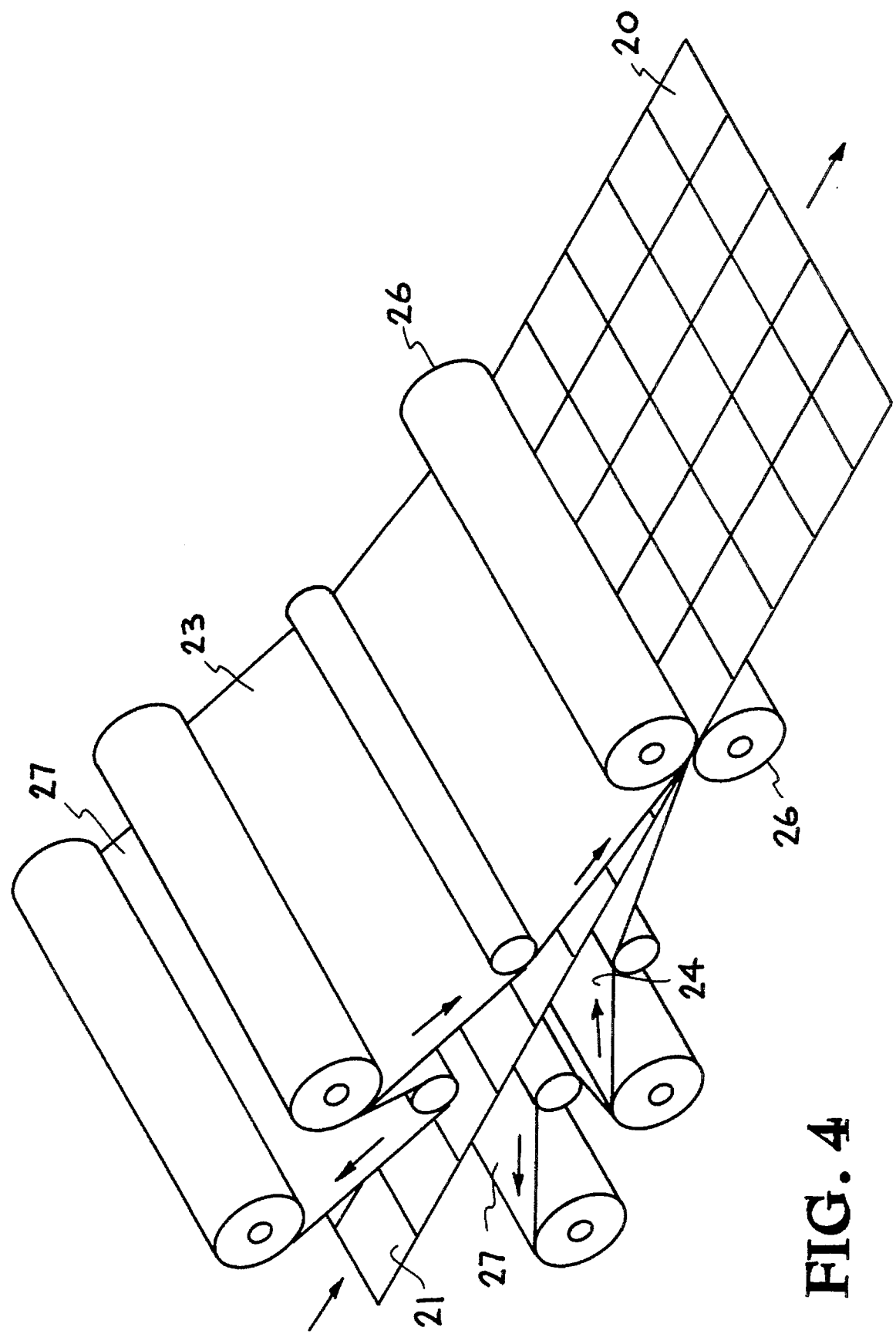
FIG. 4 is a schematic illustration of the solar array lamination process.

FIG. 3 illustrates a solar cell module with the cells interconnected as above described and illustrated in FIGS. 1 and 2 encapsulated in a laminate structure. The module indicated at 20 consists of a plurality of individual solar cells 21, only two shown, which are electrically interconnected by metallic interconnects 22, only one shown, by the process of either Example I or Example II described above. The solar cells are encapsulated between two fluoropolymer/adhesive layers generally indicated at 23 and 24, each of the encapsulation layers 23 and 24 being composed of a layer of adhesive 25 and a layer of fluoropolymer 26. The process for encapsulating the solar cells as shown in FIG. 3 is described in detail and claimed in above-referenced copending application Ser. No. 08/230,509. That process is generally described by the illustration of FIG. 4. As the release liners 27 and 27[1] are removed the top and bottom laminate layers 23 and 24 are fed between heated laminating rollers 26 of a laminating apparatus. The electrically connected solar cells 21 are then fed through the rollers 26 and are hermetically sealed by the top and bottom laminate layers 23 and 24 to form a laminated module 20. The cells pass through the rollers of the laminating apparatus twice. The first pass is with the rollers 26 at room temperature (about 25° C.) and causes the solar cells to be laminated to the top and bottom layers 23 and 24. The second pass through the rollers 28 is at 140° F. (60° C.) and causes the adhesive layers 25 to reflow and at least partially fill the space between the cells 21, as shown in FIG. 3, and hermetically seal the solar array module 20.

It has thus been shown that the present invention provides a process for producing electrical interconnects between solar cells using a silver-based material consisting of either a Ag-silicone paste or a Pb-Sn-based solder cream. When this interconnect fabrication process is combined with the above-referenced solar cell lamination process, the finished product is a light weight, flexible, hermetically sealed solar array module. This overall process involves first electrically interconnecting the solar cells with an inexpensive, easy to use, Ag-silicone paste or Pb-Sn based solder cream, followed by laminating between two fluoropolymer/silicone adhesive sandwiched layers. The end result being a high power to weight ratio solar array modules.

While the invention has been experimentally verified using a conductive silver-based paste or Pb-Sn solder cream, other conductive metal base materials may be utilized to produce the paste or solder cream, provided such produces interconnects which have no degradation under high current and have the necessary low contact resistance values for electronic applications.

When specific materials, parameters, compositions, mixtures, and operational sequences have been set forth to describe the invention such are not intended to be limiting. Modifications and changes will become apparent to those skilled in the art, and it is intended that the invention be limited only by the scope of the appended claims.

We claim:

1. A plurality of solar cells electrically interconnected by at least one conductive metal strip and a silver based low temperature bonding material between the conductive metal strip and at least one electrode of the solar cells.

2. The plurality of solar cells of claim 1, laminated between sandwiched layers of fluoropolymer/adhesive material which encapsulate and hermetically seal the solar cells therein.

3. The plurality of solar cells of claim 1, wherein the silver-based material is a silver-silicone paste.

4. The plurality of solar cells of claim 1, wherein the at least one conductive metal strip is composed of copper or silver.

5. The plurality of solar cells of claim 4, wherein the at least one conductive metal strip has a width of about 50 mil and thickness of about 3 mil.

6. A process for electrically interconnecting a plurality of thin solar cells each having a positive and a negative electrode, comprising:

providing a plurality of conductive metal strips;

applying a lead-tin solder cream bonding material between the conductive metal strips and the electrodes; and securing the conductive metal strips to the electrodes of the solar cells to produce electrical interconnects therebetween by applying a temperature sufficient to melt the solder cream but not greater than 190°, and thereafter cooling.

7. The process of claim 6, wherein the lead-tin solder cream is composed of about 85% lead-tin and about 15% flux mixture, and wherein the lead-tin is about 37% lead and about 63% tin.

8. The process of claim 6, additionally including:

placing the interconnected solar cells between a pair of fluoropolymer/adhesive layers; and laminating the solar cells within the fluoropolymer/adhesive layers to provide a hermetically sealed solar array module.

9. The process of claim 6, wherein the conductive metal strips are composed of copper or silver.

10. The process of claim 9, wherein the conductive metal strips have a width of about 50 mil and thickness of about 3 mil.

11. The process of claim 6, wherein the lead-tin solder cream is composed of lead-tin and a flux mixture of at least rosin, terpene, polyol, and carboxylic acid.

12. The process of claim 11, wherein the lead-tin/flux mixture is composed of about 85% lead-tin and about 15% flux by weight.

13. The process of claim 11, wherein the lead-tin is composed of about 37% lead and about 63% tin by weight.

14. A process for electrically interconnecting a plurality of thin solar cells each having a positive and negative electrode, comprising:

providing a plurality of conductive metal strips;

applying a metal-based material between the conductive metal strips and the electrodes, said metal-based material being composed of a silver-silicone paste; and securing the conductive metal strips to the electrodes of the solar cells to produce electrical interconnects therebetween at room temperature, and thereafter curing (cured) at room temperature to harden the silver-silicone paste.

15. The process of claim 14, wherein the silver-silicone paste is composed of 85% silver, 14% silicone, and 1% solvent.

16. The process of claim 14, wherein the curing is carried out at room temperature for a period of about 90 minutes to harden the silver-silicone paste.

* * * * *